(12) United States Patent
Wallberg et al.

(10) Patent No.: US 7,411,462 B2
(45) Date of Patent: Aug. 12, 2008

(54) BUILT-IN SELF TEST METHOD FOR A DIGITALLY CONTROLLED CRYSTAL OSCILLATOR

(75) Inventors: John Wallberg, Richardson, TX (US); Robert B. Staszewski, Garland, TX (US); Vanessa M. Bodrero, Saint Laurant du Var (FR)

(73) Assignee: Texas Instruments Incorporated, Dallas, TX (US)

( * ) Notice: Subject to any disclaimer, the term of this patent is extended or adjusted under 35 U.S.C. 154(b) by 90 days.

(21) Appl. No.: 11/551,124

(22) Filed: Oct. 19, 2006

(65) Prior Publication Data

US 2007/0182496 A1   Aug. 9, 2007

Related U.S. Application Data

(60) Provisional application No. 60/728,402, filed on Oct. 19, 2005.

(51) Int. Cl.
*G01R 23/00* (2006.01)
*H03B 5/32* (2006.01)
*H03M 1/00* (2006.01)

(52) U.S. Cl. .................. 331/44; 331/158; 331/179; 341/126

(58) Field of Classification Search .................. 331/44, 331/116 R, 116 FE, 158, 177 R, 179; 341/126, 341/144, 155
See application file for complete search history.

(56) References Cited

U.S. PATENT DOCUMENTS

2003/0133522 A1   7/2003   Staszewski et al.

| | | |
|---|---|---|
| 2004/0146132 A1 | 7/2004 | Staszewski et al. |
| 2006/0033582 A1 | 2/2006 | Staszewski et al. |
| 2006/0038710 A1 | 2/2006 | Staszewski et al. |
| 2007/0182496 A1* | 8/2007 | Wallberg et al. .......... 331/36 C |

OTHER PUBLICATIONS

R. B. Staszewski et al., "All-Digitial PLL and GSM/Edge Transmitter in 90nm CMOS," IEEE International Solid-State Circuits Conference, Feb. 2005, pp. 316-217, 600.
R. B. Staszewski et al., "A Digitally Controlled Oscillator in a 90 nm Digital CMOS Process for Mobile Phones," IEEE Journal of Solid-State Circuits, vol. 40, No. 11, Nov. 2005, pp. 2203-2211.

(Continued)

*Primary Examiner*—David Mis
(74) *Attorney, Agent, or Firm*—Ronald O. Neerings; Wade James Brady, III; Frederick J. Telecky, Jr.

(57) ABSTRACT

A novel testing mechanism operative to test large capacitor arrays such as those used in a digitally controlled crystal oscillator (DCXO). The invention is adapted for use in DCXO circuits that employ dynamic element matching in their array decoding circuits. The invention combines the use of DEM during regular operation of the DCXO with a testing technique that greatly reduces the number of tests required. The invention tests the capacitors in the array on a row by row, wherein all the capacitors in a row are tested lumped together and treated as a single entity, which results in significantly reduced testing time. This permits the measurement of significantly higher frequency deviations due to the larger capacitances associated with an entire row of capacitors being tested.

25 Claims, 5 Drawing Sheets

OTHER PUBLICATIONS

R. B. Staszewski et al., "All-Digital PLL and Transmitter for Mobile Phones," IEEE Journal of Solid-State Circuits, vol. 40, No. 12, Dec. 2005, pp. 2469-2482.

C. H. Hung et al., "A Digitally Controlled Oscillator System for Saw-Less Transmitters in Cellular Handsets," IEEE Journal of Solid-State Circuits, vol. 41, No. 5, May 2006, pp. 1160-1170.

K. Muhammad et al., "The First Fully Integrated Quad-Band GSM/GPRS Receiver in a 90-nm Digital CMOS Process," IEEE Journal of Solid-State Circuits, vol. 41, No. 8, Aug. 2006, pp. 1772-1783.

Y. C. Ho et al. "Charge-Domain Signal Processing of Direct RF Sampling Mixer with Discrete-Time FIlters in Bluetooth and GSM Receivers," EURASIP Journal on Wireless Communications and Networking, vol. 2006, Article 62905, pp. 1-14.

M. Nakai et al., "Dynamic Voltage and Frequency Management for a Low-Power Embedded Microprocessor," IEEE Journal of Solid-State Circuits, vol. 40, No. 18, Jan. 2006, pp. 28-35.

* cited by examiner

BUILT-IN SELF TEST METHOD FOR A DIGITALLY CONTROLLED CRYSTAL OSCILLATOR

REFERENCE TO PRIORITY APPLICATION

This application claims priority under 35 U.S.C. § 119(e) to U.S. Provisional Application Ser. No. 60/728,402, filed Oct. 19, 2005, entitled "Built-in self test method for digitally controlled xtal oscillator (DCXO)," incorporated herein by reference in its entirety.

FIELD OF THE INVENTION

The present invention relates to the field of communications and more particularly relates to a built-in self test method for a digitally controlled crystal oscillator (DCXO).

BACKGROUND OF THE INVENTION

Crystal oscillators are used as stable frequency sources in a wide range of applications including RF, digital circuits, etc. Crystal oscillators, which are comprised of a crystal generally manufactured from quartz and an active amplifier that provides a negative resistance to perpetuate the oscillation, are widely used because they provide a relatively accurate clock/frequency source. They typically provide a better long-term quality clock than other available clock sources such as ceramic resonators, LC tank circuits, etc. Crystal oscillators, however, are not perfect and often it is necessary to tune their output frequency in order to meet system requirements.

The tuning of the output frequency of an oscillator circuit based on a quartz crystal frequency source is typically achieved by a device called a varactor. Varactors are diodes operated reverse biased so no current flows, but since the width of the depletion zone varies with the applied bias voltage, the capacitance of the diode can be made to vary. In CMOS processes, varactors are formed by placing a heavily positively-doped region (called a P+ implant) inside a lightly positively-doped region (called a PWELL). The capacitance of these junctions behaves similarly to that of an NMOS transistor, which has an N+ implant inside a lightly negatively-doped region (called an NWELL), which also forms a P-N junction device.

In typical prior art oscillators, a single varactor is used which makes tuning the oscillator a relatively simple procedure. Alternatively, an array of capacitors arranged in a matrix can be used as the tuning element.

A block diagram illustrating a prior art digitally controlled crystal oscillator (DCXO) incorporating a varactor matrix is shown in FIG. 1. The DCXO circuit, generally referenced 10, comprises an external quartz crystal 12, an oscillator circuit 14 and varactor matrix 16. In this example, the quartz crystal 12 is connected to a one transistor oscillator called a Colpitts oscillator. The oscillator is digitally controlled whereby the center frequency of the oscillator output 20 is adjusted by adding parallel capacitance to the circuit such that it would be reflected directly or indirectly to the crystal. This causes slight changes in the output frequency of the oscillator. Since the physical properties of the quartz crystal are fixed, the range of adjustment of the center frequency is relatively small, on the order of 10-20 parts per million (ppm).

In the case of an array of capacitors 16, a digital tuning command 18 is used to determine the total capacitance applied to the oscillator circuit. The digital tuning command is translated to row and column decode signals which control the on/off state of all the capacitors in the matrix.

A problem arises in the need to test all the capacitors in the matrix. In the case of a single varactor, testing is rather trivial. With a large matrix of capacitors, however, testing is more difficult. Each capacitor, having a size on the order of femtofarads, represents a very small share of the total ppm, for example 0.01 ppm. If we assume a center frequency of 26 MHz, for example, this translates to a frequency of less than 1 Hz. Thus, testing each individual capacitor for a frequency of less than 1 Hz will require more than 1 second. Considering an array of tens or hundreds or even thousands of capacitors requires more than an hour of testing. This is an astronomical cost for testing the varactor matrix using modern test equipment.

An alternative approach to testing is to probe each individual capacitor. This, however, is also not practical as each capacitor is measured in femtofarads, applying '0' or '1' digital state to each capacitor changes the state by approximately hundreds of electrons. Typical probes have a minimum capacitance themselves on the order of picofarads, thus making them unsuitable for use in measure such capacitor arrays.

Another problem with the DCXO circuit 10 is that a failed capacitor creates nonlinearity in the output frequency versus the digital tuning command. An example of this problem is shown in FIG. 2. The solid line 30 represents the output frequency trajectory versus input code (i.e. tuning command). Assuming for example, the capacitor in the first row, column seven of the matrix is bad. Thus, a change in the input code from 6 to 7 does not yield an increase in output frequency. The expected trajectory of the output frequency is shown in the dotted line 32. Thus, all codes from 7 and up result in incorrect output frequencies.

There is thus a need for a DCXO self test mechanism that is capable of testing an array of capacitors that does not require lengthy and costly testing time. It is also desirable that the self test mechanism provide a capability to overcome the nonlinearities in output frequency caused by failed capacitor elements.

SUMMARY OF THE INVENTION

The present invention overcomes the problems associated with the prior art by providing a testing mechanism operative to test large capacitor arrays such as those used in a digitally controlled crystal oscillator (DCXO). The invention is operative in DCXO circuits that employ dynamic element matching, which is a technique originally used in analog DAC circuit designs to linearize mismatch between fixed elements by rotating or shifting between the different elements thus smearing or averaging any differences between them over time.

The invention takes advantage of the use of the DEM technique during regular operation of the DCXO by combining it with a novel testing technique. Rather than test the capacitor array by measuring the frequency of each individual capacitor, the present invention is operative to measure the capacitors in the array on a row by row, wherein all the capacitors in a row are tested lumped together and treated as a single entity. Thus, each row is treated as one unit and not as individual capacitors.

Thus, the test method of the present invention is operative to test the entire capacitor matrix by testing each entire row as a single entity. Rather than test each individual capacitor in the matrix with its impractical long and costly test time, the present invention permits significantly reduced test time. Depending on the size of the array, the use of the test method of the invention permits the capacitor array to be tested whereas without it, testing of the array could not be performed due to the length and cost of testing each individual capacitor.

This greatly reduces the requirements for testing. Instead of requiring a test of each individual capacitor, the invention permits complete testing of the entire array by testing each row as a single unit. A benefit of this is that rather than needing to test a very small value of capacitance for possibly seconds (i.e. less than 1 Hz), the invention requires testing of N times that value (where N is the number of capacitors in a row) which translates to a much higher and more practical frequency to measure since testing entire rows generates significantly higher frequency deviations.

There is thus provided in accordance with the invention, a method of testing a capacitor matrix organized as a plurality of rows and columns, for use in a digitally controlled oscillator (DCO) incorporating dynamic element matching (DEM), the method comprising the steps of performing testing of the capacitor matrix on a row by row basis, wherein each entire row of capacitors is tested as a single entity and analyzing results of each test against expected frequency characteristics of an entire row of capacitors combined.

There is also provided in accordance with the invention, a built-in self test method of testing a digitally controlled crystal oscillator (DCXO) comprising a capacitor matrix organized as a plurality of rows and columns and incorporating dynamic element matching (DEM), the method comprising the steps of testing the capacitor matrix on a row by row basis, wherein each row of capacitors is tested as a single unit and indicating a test failure if the results of a row test is not with a predetermined specification.

There is further provided in accordance with the invention, a digitally controlled crystal oscillator (DCXO) comprising an oscillator circuit coupled to an external crystal, a capacitor matrix coupled to the oscillator circuit, a row decode circuit coupled to the capacitor matrix, a column decode circuit coupled to the capacitor matrix, wherein a digital tuning command applied to the row decode circuit and the column decode circuit determines an output frequency of the DCXO, a dynamic element matching (DEM) circuit coupled to the row decode circuit and wherein use of the DEM circuit permits testing of the capacitor matrix on a row by row basis such that each row of capacitors is tested as a single unit.

There is also provided in accordance with the invention, a method of testing a plurality of capacitors, for use in a digitally controlled oscillator (DCO) incorporating dynamic element matching (DEM), the method comprising the steps of performing testing of groups of the capacitors, wherein each group of capacitors is tested as a single entity and analyzing results of each test against expected frequency characteristics of an entire group of capacitors combined.

There is further provided in accordance with the invention, a method of testing a plurality of digitally-controlled conversion devices in a circuit incorporating dynamic element matching (DEM), the method comprising the steps of performing testing of groups of the digitally-controlled conversion devices, wherein each group of the digitally-controlled conversion devices is tested as a single entity and analyzing results of each test against expected characteristics of an entire group of digitally-controlled conversion devices combined.

Note that some aspects of the invention described herein may be constructed as software objects that are executed in embedded devices as firmware, software objects that are executed as part of a software application on either an embedded or non-embedded computer system such as a central processing unit (CPU), digital signal processor (DSP), microcomputer, minicomputer, microprocessor, etc. running a real-time operating system such as WinCE, Symbian, OSE, Embedded LINUX, etc. or non-real time operating system such as Windows, UNIX, LINUX, etc., or as soft core realized HDL circuits embodied in an Application Specific Integrated Circuit (ASIC) or Field Programmable Gate Array (FPGA), or as functionally equivalent discrete hardware components.

BRIEF DESCRIPTION OF THE DRAWINGS

The invention is herein described, by way of example only, with reference to the accompanying drawings, wherein.

DETAILED DESCRIPTION OF THE INVENTION

Notation Used Throughout

The following notation is used throughout this document.

| Term | Definition |
| --- | --- |
| AFC | Automatic Frequency Control |
| ASIC | Application Specific Integrated Circuit |
| CMOS | Complementary Metal Oxide Semiconductor |
| CPU | Central Processing Unit |
| DAC | Digital to Analog Converter |
| DCXO | Digitally Controlled Crystal Oscillator |
| DEM | Dynamic Element Matching |
| DSP | Digital Signal Processor |
| FPGA | Field Programmable Gate Array |
| HDL | Hardware Description Language |
| NMOS | n-channel Metal Oxide Semiconductor |
| RF | Radio Frequency |

Capacitor Matrix Test Mechanism

The present invention is a testing mechanism operative to test large capacitor arrays such as those used in a digitally controlled crystal oscillator (DCXO). The invention is adapted for use in DCXO circuits that employ dynamic element matching in their array decoding circuits. The invention combines the use of DEM during regular operation of the DCXO with a testing technique that greatly reduces the number of tests required. The invention tests the capacitors in the array on a row by row, wherein all the capacitors in a row are tested lumped together and treated as a single entity, which results in significantly reduced testing time. This permits the measurement of significantly higher frequency deviations due to the larger capacitances associated with an entire row of capacitors being tested Note that throughout this document, the terms capacitor and varactor are generally intended to be used interchangeably. It is not critical to the operation of the invention whether the DCXO capacitor arrays are implemented using capacitors or varactors.

Figure 1:
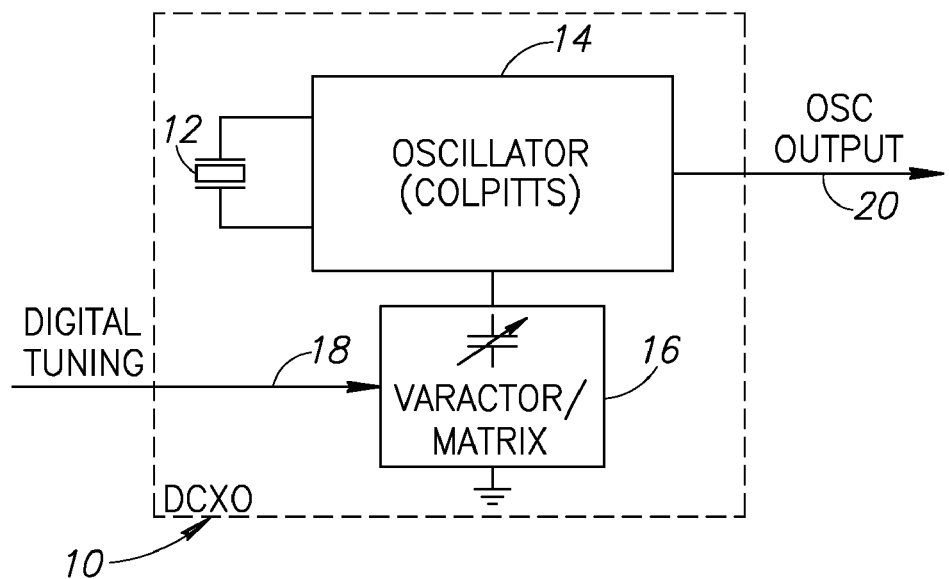
FIG. 1 is a block diagram illustrating a prior art digitally controlled crystal oscillator (DCXO) incorporating a varactor matrix.
Figure 2:
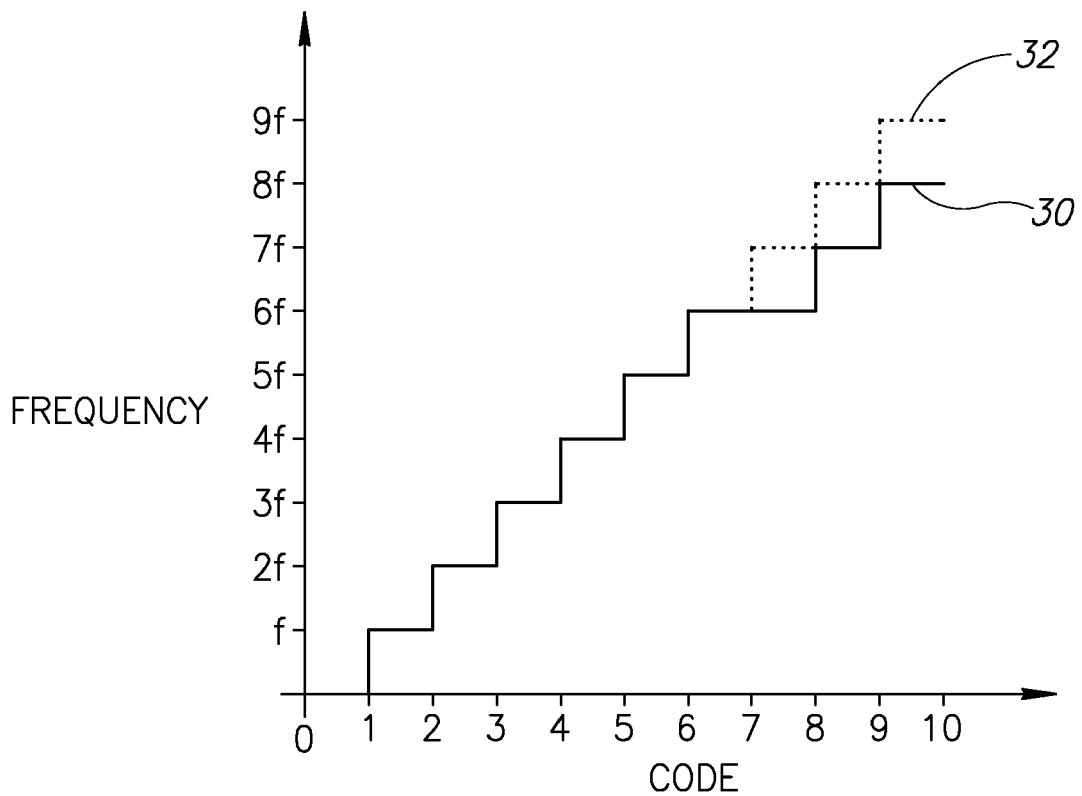
FIG. 2 is a graph illustrating the cumulative nonlinearity of the prior art DCXO circuit of FIG. 1.
Figure 3:
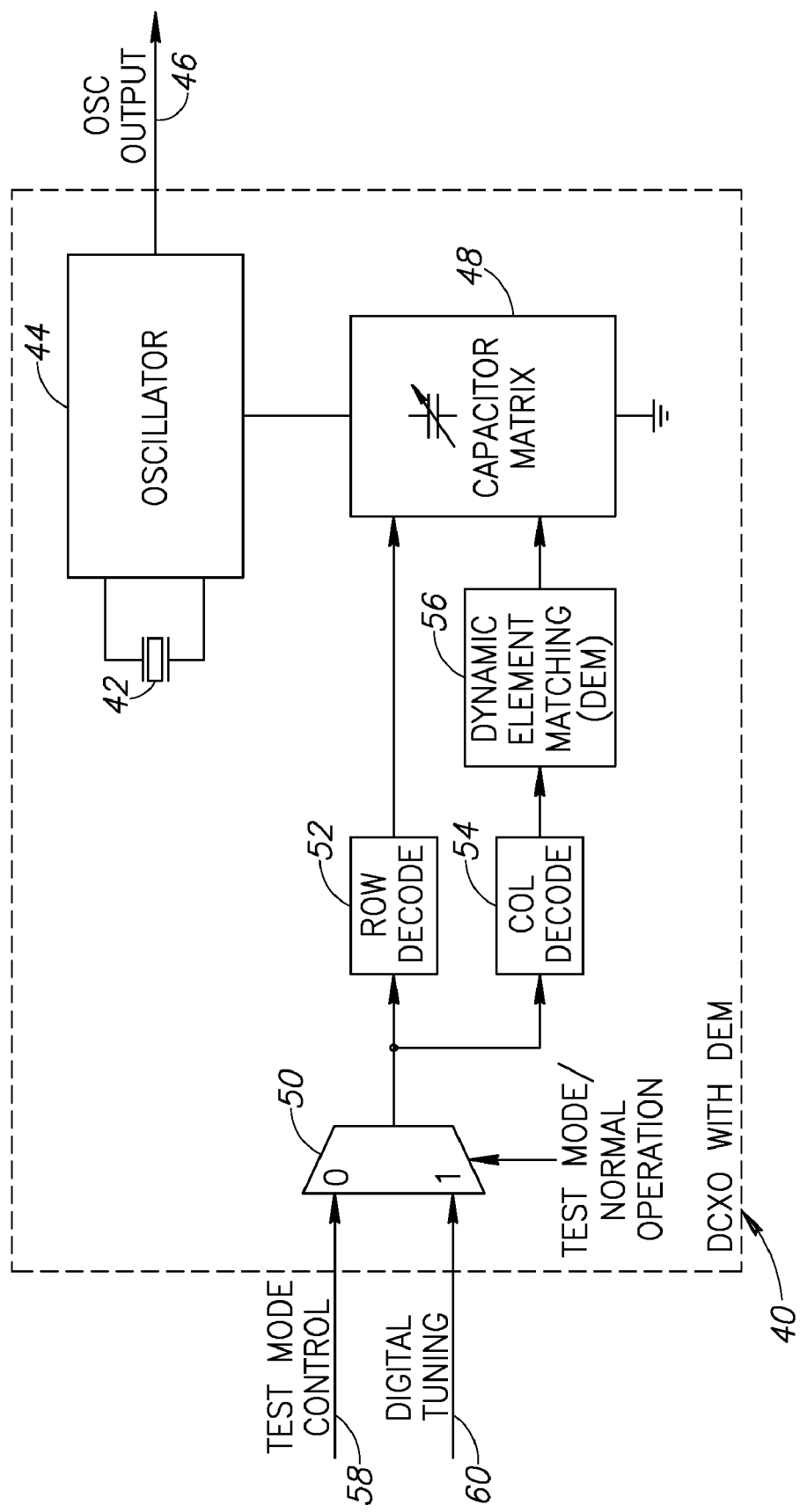
FIG. 3 is a block diagram illustrating an example embodiment of the DCXO self test mechanism of the present invention incorporating dynamic element matching (DEM)

A block diagram illustrating an example embodiment of the DCXO self test mechanism of the present invention incorporating dynamic element matching (DEM) is shown in FIG. 3. The DCXO circuit, generally referenced 40, comprises an external quartz crystal 42, oscillator circuit 44, capacitor matrix 48, a mode switching multiplexer 50, row decode circuit 52, column decode circuit 54 and dynamic element matching (DEM) circuit 56. Note that the description of the test mechanism of the invention is provided in the context of an example matrix comprising 1024 capacitors organized as 32 rows by 32 columns. It is not intended that the invention be limited to the examples presented herein as one skilled in the art can apply the principles of the present invention to matrices of any desired size. It should also be noted that the term "matrix" is only for ease of understanding and to better deal with large number of similar-size devices for the purpose of their addressing and encoding of the input word that controls their configuration. It does not imply that the device layout structure be done in exact row and column arrangement. The layout structure could be linear, two-dimensional, three-dimensional or even irregular.

A hardware description language (HDL) based implementation of the DEM of FIG. 3 is provided below in Listing 1.

Listing 1: HDL version of DEM Circuit

```
-- Encode the column process (tune_ti_1)
begin
   case tune_ti_1 is
      when "000" => col <= "00000000";
      when "001" => col <= "00000001";
      when "010" => col <= "00000011";
      when "011" => col <= "00000111";
      when "100" => col <= "00001111";
      when "101" => col <= "00011111";
      when "110" => col <= "00111111";
      when "111" => col <= "01111111";
      when others => col <= "XXXXXXXX";
   end case;
end process;

-- Rotate the column (Dynamic Weighted Average shift)

process (bubble, col, mem_dem_t)
begin
if mem_dem_t = '1' then
   case bubble is
      when "00000000" => rot_col <= col;
      when "00000001" => rot_col <= col(8 downto 1);
      when "00000010" => rot_col <= col(7 downto 1) &
         col(8);
      when "00000100" => rot_col <= col(6 downto 1) &
         col(8 downto 7);
      when "00001000" => rot_col <= col(5 downto 1) &
         col(8 downto 6);
      when "00010000" => rot_col <= col(4 downto 1) &
         col(8 downto 5);
      when "00100000" => rot_col <= col(3 downto 1) &
         col(8 downto 4);
      when "01000000" => rot_col <= col(2 downto 1) &
         col(8 downto 3);
      when "10000000" => rot_col <= col(1) & col(8 downto 2);
      when others => rot_col <= "XXXXXXXX";
   end case;
else
   rot_col <= col;
end if;
```

Listing 1: HDL version of DEM Circuit

```
end process;
col_select <= rot_col;

-- Compute the required shift amount process (ckr, clrz)
begin
   if clrz = '0' then
      bubble_x <= "00000000";
   elsif ckr'event and ckr = '1' then
      if ctl_srst_t='1' or mem_dem_t='0' then
         bubble_x <= "00000000";
      else
         -- detect bubble
         bubble_x(1) <= rot_col(8) and (not rot_col(1));
         for i in 2 to 8 loop
            bubble_x(i) <= rot_col(i-1) and (not rot_col(i));
         end loop;
      end if;
   end if;
end process;
```

An assumption of the invention is that the DCXO employs dynamic element matching in the row decode circuit. For a given tuning code, the DEM is operative to cyclically shift between the columns of a row each clock cycle thus averaging all the capacitors in a row over time. Use of DEM in the DCXO provides a level of fault tolerance in that a failure of one or two (or more) capacitors does not detrimentally effect the operation of the oscillator. At some point, however, too many failed capacitors will cause the output of the oscillator to go out of spec.

Figure 4A:
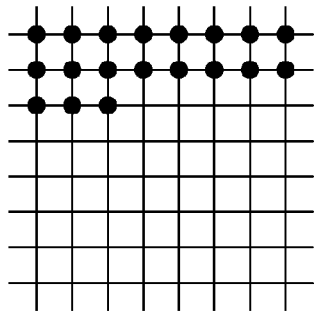
FIGS. 4A to 4H are diagrams illustrating the dynamic element matching via cyclic shifting within a row.
Figure 4B:
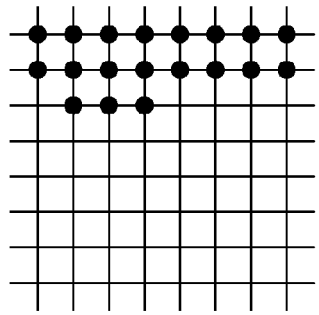
Figure 4C:
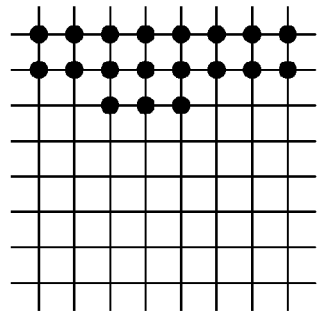
Figure 4D:
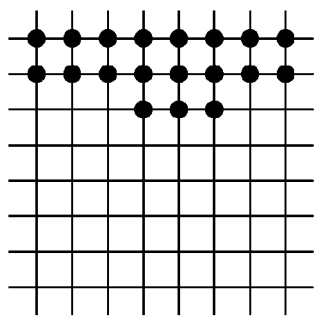
Figure 4E:
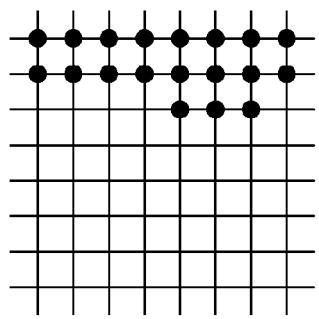
Figure 4F:
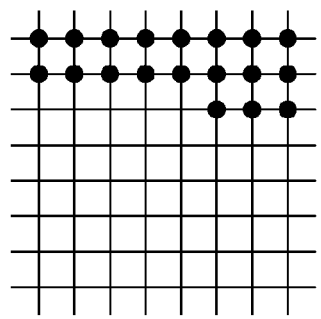

Diagrams illustrating the dynamic element matching via cyclic shifting within a row are shown in FIGS. 4A to 4H. For clarity sake, a smaller 8×8 capacitor matrix is shown rather than a 32×32. A tuning code of 19 is input to the DXCO and the row and column decoders are operative to turn on the first two rows of capacitors. In the third row, however, the DEM circuit is operative to turn on three of the capacitors in the row in a cyclic manner from one clock cycle to the next. In FIG. 4A, the capacitors in the first three columns are turned on. In FIG. 4B, the capacitors in columns 2, 3, 4 are turn on. This continues in FIG. 4C (columns 3, 4, 5), FIG. 4D (columns 4, 5, 6), FIG. 4E (columns 5, 6, 7), FIG. 4F (columns 6, 7, 8), FIG. 4G (columns 1, 7, 8) and FIG. 4H (columns 1, 2, 8). Note that although only eight cyclic shifts are shown, other shift orders are possible as well. The operation of the DEM for other codes, 20, 21, etc. is similar.

Thus, if the code within a row is 2 (out of 8), for example. Using DEM, no capacitors in the row are specifically assigned to that code. Rather, the two capacitors are effectively distributed throughout the row. On the first clock cycle columns 1 and 2, on the second clock cycle columns 2 and 3, and so on with rotations (i.e. cyclic shifts) at each clock cycle. It is important to note that the total number of capacitors remains the same for a given code but the actual capacitors are rotated each clock cycle. Each code does not have a fixed corresponding location in the array.

Figure 4G:
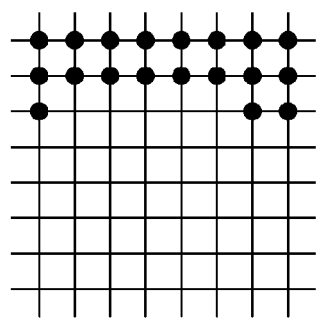
Figure 4H:
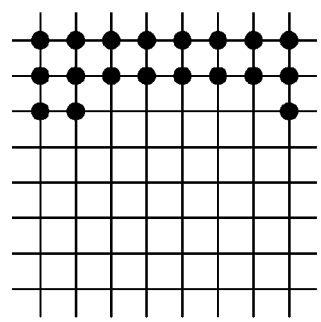

Thus, the code only represents the total number of capacitors in the 'on' state, which in this example is 8+8+3=19. This code corresponds to a certain frequency deviation. With every clock cycle the actual columns turned on within row three are cycled. In this example, after eight clock cycles, we return to the starting point. Consider that the capacitor in column one in the third row is defective. Therefore, in FIG. 4A, instead of generating a frequency corresponding to code 19, the DCXO generates a frequency corresponding to code 18, since the first capacitor does not have an effect on the output. On the next clock cycle in FIG. 4B, however, the three capacitors exercised are all good. The effective code is therefore 19. In FIGS. 4C, 4D, 4E and 4F, the effective code is also 19. In FIGS. 4G and 4H, however, the effective code is 18.

When the DEM occurs quickly, the average value of the number of the effective code is between 18 and 19. Thus, the effect of the bad capacitor in significantly mitigated since what appears at the output of the oscillator is the averaged code value. Considering the 32×32 matrix, a failure of a single capacitor in a row only causes a loss of 1/32 in capacitance when the entire row is considered as a whole.

The invention takes advantage of the use of the DEM technique during regular operation of the DCXO by combining it with a novel testing technique as described hereinbelow. Rather than test the array of capacitors by measuring the frequency of each individual capacitor, the present invention is operative to measure the capacitors in the array on a row by row, wherein all the capacitors in a row are tested lumped together as a single entity. Thus, each row is treated as one unit and not as individual capacitors.

For example, the DCXO may be part of an automatic frequency control (AFC) algorithm. A digital tuning command (e.g., control word) 60 is provided which corresponds to some desired frequency change in the oscillator output. If the oscillator output does not change, the circuit the DCXO is part of is declared defective. Thus, the test mechanism of the invention is used to test the capacitor array. Although the size of the capacitors may be on order of femtofarads, corresponding to very small frequency deviations, when considering an entire row, the total capacitance is an order of magnitude higher with the consequence increase in frequency and decrease in required test time.

Thus, a key aspect of the invention is that each capacitor in the matrix is not treated individually. Rather, each row of 32 capacitors, in the example presented herein, is treated as a single unit without any loss of resolution since the DCXO applies DEM during operation. By using DEM during operation of the DCXO, there is now no need to test all the capacitors in the matrix (e.g., all 1024). It is sufficient to only test the rows as single entities. Thus, the complexity of the testing requirements is greatly reduced from 1024 individual capacitor tests to 32 row tests.

A benefit of this is that rather than needing to test a very small value of capacitance for possibly seconds (i.e. less than 1 Hz), the invention requires testing of 32 times that value which translates to a much higher and more practical frequency change to measure since testing entire rows generates significantly higher frequency deviations. Thus, use of the test mechanism of the invention replaces the need for 1024 impractically long and costly tests with 32 tests that can be performed practically using modern test equipment. Note that the invention assumes that the total number of defects per row is small, which is a valid assumption with modern semiconductor processing.

It should be noted that although there appears to be no benefit of DEM when the entire row is filled, there are many possible sequences of rotation which guarantee a certain amount of empty cells in a row or multiple rows. In addition, a combination of row and column rotation could be used to implement a DEM.

Figure 5:
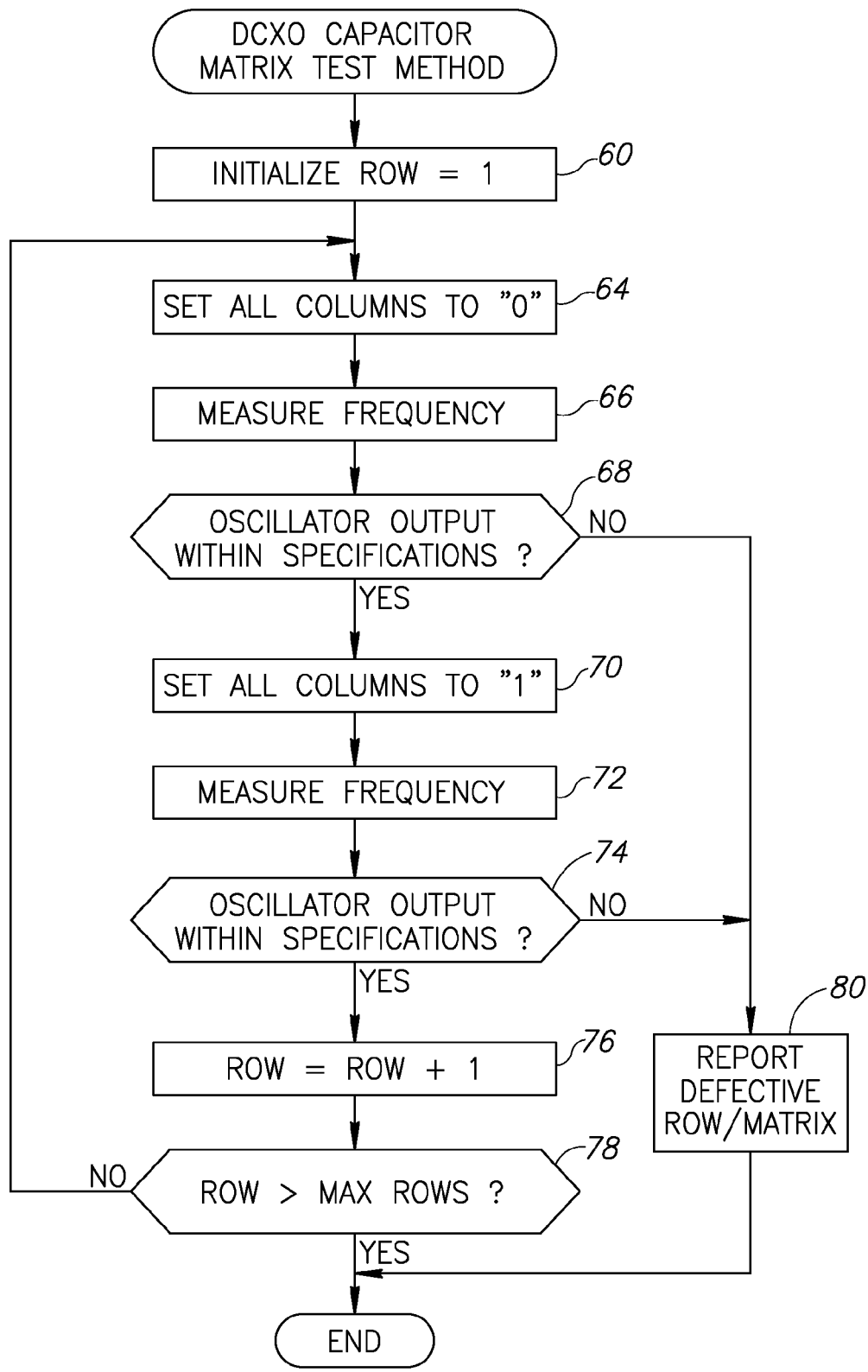
FIG. 5 is a flow diagram illustrating the DCXO capacitor matrix test method of the present invention.
Figure 6:
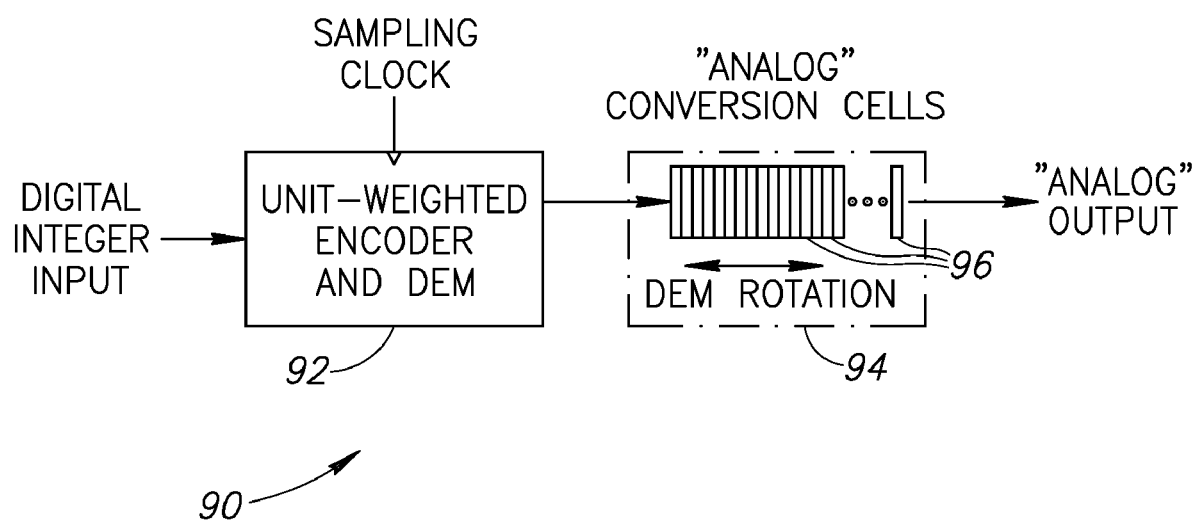
FIG. 6 is a block diagram illustrating a generalized DEM based DAC circuit incorporating a plurality of analog elements.

A flow diagram illustrating the DCXO capacitor matrix test method of the present invention is shown in FIG. 5. This method can be used by external test equipment during the manufacturing process or can be implemented internally by built-in self test circuitry within the IC incorporating the DCXO of the present invention. In addition, portions of the method may be implemented in both external test equipment and on the IC itself.

An example of such a built-in self test is described in a U.S. Publication No. 2004/0146132A1, published Jul. 29, 2004, to Staszewski et al., entitled "Radio Frequency Built-In Self Test For Quality Monitoring Of Local Oscillator And Transmitter," incorporated herein by reference in its entirety. The digital phase detector output signal (or its filtered version) is monitored and the frequency change of the frequency reference (FREF) input, which is connected to the DCXO output, is calculated. This method relies on the following principles that tie the internal ADPLL signals to the frequency change on its reference input: (1) in type-I PLL, in which the integral part of the loop filter is not used, the difference between the steady-state average or filtered values of the phase error is proportional to the reference frequency step; (2) in type-II PLL, in which the integral part of the loop filter is non-zero, the steady state change in the "rho" or integral accumulator is proportional to the reference frequency step.

The method steps through the rows one by one and performs tests on each row as a whole. The method first initializes a row variable to one (step 60). Capacitors in every column of the row are then configured to the digital '0' state (step 64). The resultant frequency is then measured (step 66). The digital '0' state of all capacitors 'off' should yield a known output from the oscillator. If the oscillator output does not meet the given specifications (step 68), an alarm or report indicating a defective row (or matrix in general) is generated (step 80).

If the oscillator output does meet the given specifications (step 68), all columns in the row are then configured to the digital '1' state (step 70) and the resultant oscillator output frequency is measured (step 72). If the oscillator output does not meet the particular specification (step 74), an alarm or report indicating a defective row (or matrix in general) is generated (step 80). If the oscillator output does meet the given specifications (step 74), the row variable is incremented by one (step 76) and if there are additional rows to test (step 78), the method continues with step 64. Thus, the frequency step from all 0s to all is measured.

Thus, the test method of the present invention is operative to test the entire capacitor matrix by testing each entire row as a single entity. Rather than test each individual capacitor in the matrix with its impractical long and costly test time, the present invention permits significantly reduced test time. Depending on the size of the array, the use of the test method of the invention permits the capacitor array to be tested whereas without it, testing of the array could not be performed due to the length and cost of testing each individual capacitor.

It is noted that it is the use of the DEM circuit in the DCXO that permits the testing of the array on a row by row basis. The cyclic shifting of capacitors by the DEM eliminates the one to one relationship between each code and the capacitors that are turned on in response thereto. Thus, failures of individual capacitors within a row (up to a certain number) are averaged thereby providing a level of fault tolerance for the DCXO. This aspect of the operation of the DEM permits the testing of the array on a row by row basis since individual failed capacitors do not necessarily result in the declaration of a failed array.

It should be noted that the methods and techniques presented herein apply to a general class of digitally-controlled oscillators (DCOs), in which the resonating device may comprise not only a crystal, but an LC tank, inverter ring, microwave guide, etc. Furthermore, the present invention of capacitance testing could also be applied to other circuit types which are not oscillators. For, example, the capacitance testing mechanism can be applied to digitally controllable capacitances in gm/C amplifiers or switched-capacitor circuits.

In addition to testing capacitances, the testing mechanism of the present invention can be applied to other electrical components as well, such as resistors, inductors or even gain elements.

A block diagram illustrating a generalized DEM based circuit incorporating a plurality of analog elements (or digitally-controlled conversion devices). The circuit, generally referenced 90, comprises a unit weighted encoder and DEM block 92 and a conversion cell block 94 comprising a plurality of analog cells 96. In a general case of a digital-to-analog converter (DAC), where the 'A' in DAC denotes 'analog' which may comprise any analog quantity (e.g., voltage, current, resistance, capacitance, frequency, power, etc), the digitally-controlled conversion devices could also be arranged using similar philosophy of using an extremely large number of the tiny unit-weighted devices.

Since it would be equally difficult to measure the tiny conversion gain of each individual device for the purpose of fault testing, the devices could be arranged such that a set of the devices would be undergoing periodical but frequent rotation as controlled by the DEM circuit. In this manner, a fault of one or a small number of devices are averaged out with good devices in order to minimize the effect of the fault. In the case of the embodiments described supra, the analog quantity ('A' in DAC) is capacitance, which gets further converted into frequency deviation through the LC resonating tank-based oscillator.

In alternative embodiments, the methods of the present invention may be applicable to implementations of the invention in integrated circuits, field programmable gate arrays (FPGAs), chip sets or application specific integrated circuits (ASICs), DSP circuits, wired or wireless implementations and other communication system products.

It is intended that the appended claims cover all such features and advantages of the invention that fall within the spirit and scope of the present invention. As numerous modifications and changes will readily occur to those skilled in the art, it is intended that the invention not be limited to the limited number of embodiments described herein. Accordingly, it will be appreciated that all suitable variations, modifications and equivalents may be resorted to, falling within the spirit and scope of the present invention.

What is claimed is:

1. A method of testing a capacitor matrix organized as a plurality of rows and columns, for use in a digitally controlled oscillator (DCO) incorporating dynamic element matching (DEM), said method comprising the steps of:
   performing testing of said capacitor matrix on a row by row basis, wherein each entire row of capacitors is tested as a single entity; and
   analyzing results of each test against expected frequency characteristics of an entire row of capacitors combined.

2. The method according to claim 1, wherein testing entire rows of capacitors as a single entity results in a significantly higher expected oscillator frequencies than compared with testing individual capacitors.

3. The method according to claim 1, wherein said step of performing testing comprises the step of setting all capacitors in a row to an 'off' state and measuring the resultant oscillator output frequency.

4. The method according to claim 1, wherein said step of performing testing comprises the step of setting all capacitors in a row to an 'on' state and measuring the resultant oscillator output frequency.

5. The method according to claim 1, wherein said capacitor matrix is organized as 32 rows by 32 columns.

6. A built-in self test method of testing a digitally controlled crystal oscillator (DCXO) comprising a capacitor matrix organized as a plurality of rows and columns and incorporating dynamic element matching (DEM), said method comprising the steps of:
   testing said capacitor matrix on a row by row basis, wherein each row of capacitors is tested as a single unit; and
   indicating a test failure if the results of a row test is not with a predetermined specification.

7. The method according to claim 6, wherein said step of testing comprises the step of setting all capacitors in a row to an 'off' state and measuring the resultant oscillator output frequency.

8. The method according to claim 6, wherein said step of testing comprises the step of setting all capacitors in a row to an 'on' state and measuring the resultant oscillator output frequency.

9. The method according to claim 6, wherein said capacitor matrix is organized as 32 rows by 32 columns.

10. The method according to claim 6, wherein said step of indicating a test failure comprises analyzing the results of each test against expected frequency characteristics of an entire row of capacitors combined.

11. The method according to claim 6, wherein use of said DEM circuit permits testing of said capacitor matrix on a row by row basis such that each row of capacitors is tested as a single unit.

12. The method according to claim 6, wherein said DEM provides a degree of tolerance against a certain number of failed capacitors within each row of said matrix.

13. A digitally controlled crystal oscillator (DCXO), comprising:
   an oscillator circuit coupled to an external crystal;
   a capacitor matrix coupled to said oscillator circuit;
   a row decode circuit coupled to said capacitor matrix;
   a column decode circuit coupled to said capacitor matrix, wherein a digital tuning command applied to said row decode circuit and said column decode circuit determines an output frequency of said DCXO;
   a dynamic element matching (DEM) circuit coupled to said row decode circuit; and
   wherein use of said DEM circuit permits testing of said capacitor matrix on a row by row basis such that each row of capacitors is tested as a single unit.

14. The apparatus according to claim 13, wherein said DEM circuit is operative to provide a level of fault tolerance to said DCXO through cyclic shifting of columns within each row.

15. The apparatus according to claim 13, wherein said DEM circuit is operative to average the effect of failed capacitors in a row thus enabling the testing of said capacitor matrix on a row by row basis.

16. The apparatus according to claim 13, wherein testing entire rows of capacitors as a single entity enables testing for significantly higher expected oscillator output frequencies than compared with individual capacitors.

17. The apparatus according to claim 13, wherein testing comprises setting all capacitors in a row to an 'off' state and measuring the resultant oscillator output frequency.

18. The apparatus according to claim 13, wherein testing comprises setting all capacitors in a row to an 'on' state and measuring the resultant oscillator output frequency.

19. The apparatus according to claim 13, wherein said capacitor matrix is organized as 32 rows by 32 columns.

20. The apparatus according to claim 13, further comprising means for determining a change to said DCXO frequency based on monitoring of a phase error signal.

21. The apparatus according to claim 13, further comprising means for determining a change to said DCXO frequency based on monitoring of accumulated phase error.

22. A method of testing a plurality of capacitors, for use in a digitally controlled oscillator (DCO) incorporating dynamic element matching (DEM), said method comprising the steps of:
    performing testing of groups of said capacitors, wherein each group of capacitors is tested as a single entity; and
    analyzing results of each test against expected frequency characteristics of an entire group of capacitors combined.

23. A method of testing a plurality of digitally-controlled conversion devices in a circuit incorporating dynamic element matching (DEM), said method comprising the steps of:
    performing testing of groups of said digitally-controlled conversion devices, wherein each group of said digitally-controlled conversion devices is tested as a single entity; and
    analyzing results of each test against expected characteristics of an entire group of digitally-controlled conversion devices combined.

24. The method according to claim 23, wherein said digitally-controlled conversion devices comprise varactors.

25. The method according to claim 23, wherein said analyzing means are based on monitoring a phase error signal.

* * * * *